United States Patent [19]
Rich

[11] 3,961,961
[45] June 8, 1976

[54] POSITIVE OR NEGATIVE DEVELOPABLE PHOTOSENSITIVE COMPOSITION

[75] Inventor: Larry D. Rich, St. Paul, Minn.

[73] Assignee: Minnesota Mining and Manufacturing Company, St. Paul, Minn.

[22] Filed: Nov. 20, 1972

[21] Appl. No.: 308,121

[52] U.S. Cl. ................................ 96/83; 96/36.4; 96/86 P; 96/87 R; 96/36.2; 96/33; 96/115 P
[51] Int. Cl.² ........................................... G03C 1/68
[58] Field of Search ............ 96/115, 36.4, 83, 86 P, 96/87 R; 260/471

[56] References Cited
UNITED STATES PATENTS

| | | | |
|---|---|---|---|
| 3,024,180 | 3/1962 | McGraw | 96/36.4 |
| 3,427,161 | 2/1969 | Laridon | 96/36.4 |
| 3,583,940 | 6/1971 | Rao | 96/115 |
| 3,594,175 | 7/1971 | Hay | 96/115 |
| 3,617,278 | 11/1971 | Holstead | 96/36.4 |

Primary Examiner—David Klein
Assistant Examiner—John L. Goodrow
Attorney, Agent, or Firm—Alexander, Sell, Steldt & DeLaHunt

[57] ABSTRACT

A positive and negative developable photosensitive composition including a photopolymerizable monomer, photoinitiator, and a blend of polymers, one an acid soluble amino containing polymer, the other a compatible, acid insoluble, film-forming, polymer. The composition, which can be developed positively with dilute aqueous acid or negatively with dilute base, is useful in silk screen printing and as a photoresist composition in general.

10 Claims, 3 Drawing Figures

POSITIVE OR NEGATIVE DEVELOPABLE PHOTOSENSITIVE COMPOSITION

This invention relates to a composition of matter capable of providing a positive and negative developable film upon imagewise exposure to actinic radiation. The invention includes the composition of matter, articles made therefrom, and methods relating thereto. The composition of matter includes a photopolymerizable monomer, a photoinitiator therefor, and a blend of polymers comprising at least one acid soluble amine containing polymer and at least one film forming, acid insoluble polymer.

Photopolymerizable compositions finding utility in the field of photoresists and the like are known — see, for example, U.S. Pat. Nos. 3,579,343; 3,578,458; and 2,893,868. Typically, such compositions are applied to a base sheet, exposed to a pattern of actinic radiation which causes an alteration in the solubility or removeability properties of the composition, and such alteration utilized by treating the imagewise exposed composition with a developing agent to selectively remove portions of the composition to provide a pattern corresponding to the pattern of actinic radiation employed. The pattern may be either a positive image resulting from removal of unexposed regions of the composition or a negative image resulting from removal of exposed regions of the composition. The present invention provides a composition which is capable of providing a single structure with both positive and negative development capabilities, and offers significant advantages as will be noted hereinafter.

SUMMARY OF THE INVENTION

In accordance with the present invention there is provided a light-sensitive composition comprising:

1. at least one free-radical polymerizable monomer having at least one terminal vinyl group and a boiling point above 100° C.,
2. at least one photoinitiator in an amount sufficient to polymerize said polymerizable monomer upon exposure to actinic radiation, and
3. a blend comprising:
    a. at least one acid soluble amino containing polymer, and
    b. at least one compatible, acid insoluble, film-forming polymer.

said free radical polymerizable monomer and said components of said blend being present in an amount sufficient to allow said composition upon imagewise actinic radiation exposure to be developed positively and negatively as desired.

The composition may be situated over a variety of substrates, either directly on the substrate or separated by one or more intermediate layers, depending upon the end use in mind. Suitable substrates include polymeric materials, woven or nonwoven fibers, metals, glass, ceramics and paper. The substrate may be flexible or rigid. Particularly desirable forms of the present invention include a multi-layered sheet construction suitable for transferring a film of the composition of this invention to various substrates such as noted above, especially a fine mesh screen adapted for use in silk screen printing, a photoresist structure wherein the composition is coated on an electrically conductive surface of a board suitable to provide a printed circuit board or the like, a lithographic plate structure wherein the composition is applied to substrate which has a hydrophilic, oleophobic surface, and a sign or the like wherein the message is delineated by developing the composition of this invention.

Reference will now be made to the accompanying drawings wherein.

Figure 1:
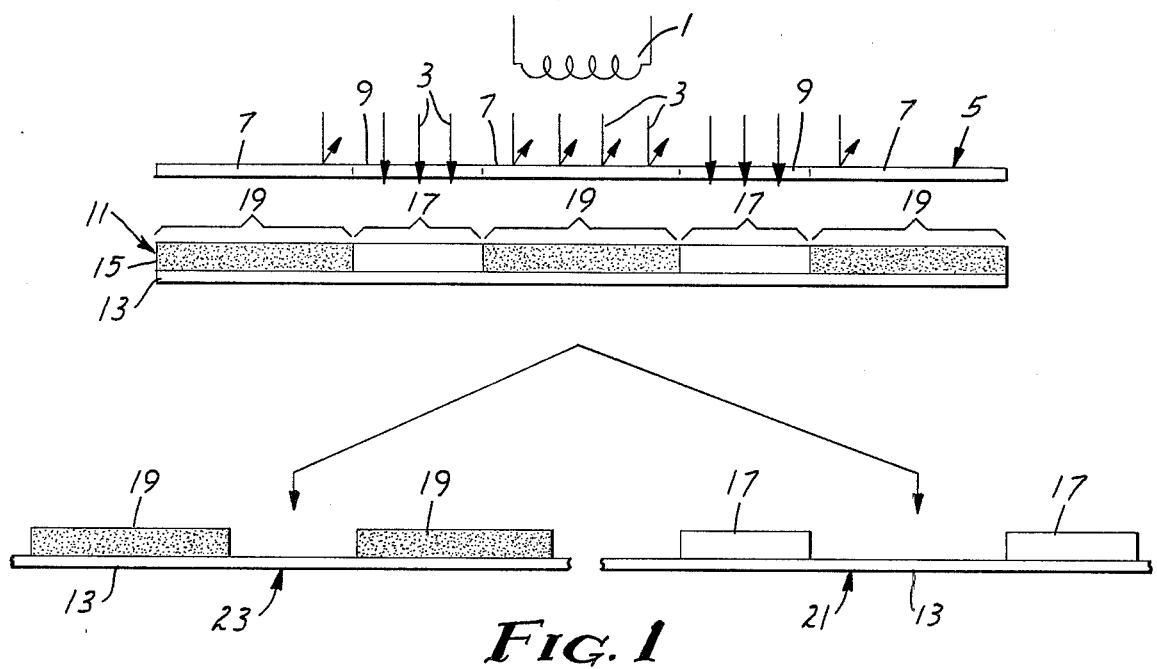
FIG. 1 is a schematic drawing depicting the dual development characteristics of the composition of this invention.

In FIG. 1 there is shown a light-source 1 emitting actinic radiation 3 which impinges upon a transparency 5 having light-blocking regions 7 and light-transparent regions 9. Situated below transparency 5 in light-receiving position is a sheet 11 including a base 13 overlying which is a layer 15 of the light-sensitive composition of this invention. Areas 17 of the layer 15, corresponding in surface area to the light-transparent regions 9 of the transparency 5, are exposed to actinic radiation whereas areas 19 thereof are unexposed.

The right-hand arrow is directed to sheet 21 which results from post-exposure development of sheet 11 with a positive-acting developer, sheet 21 including the base 13 overlying which are exposed areas 17 of sheet 11. The left-hand arrow is directed to sheet 23 which results from postexposure development of sheet 11 with a negative-acting developer, sheet 23 including the base 13 overlying which are unexposed areas 19 of sheet 11. The base 13 may be any of the above-described materials, and may be transparent or opaque and of the same or a contrasting color to the portion of the composition of the invention remaining after development.

Figure 2:
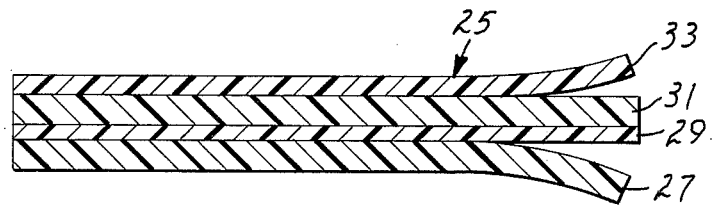
FIG. 2 is an elevational view in cross-section of a construction utilizing the composition of this invention.

In FIG. 2 there is illustrated a multi-layered structure 25 which constitutes a form of the invention particularly adapted to transferring the layer of the composition of this invention before or after exposure, or after exposure and before or after development, to another suitable substrate. The transferring components of structure 25 may be the layer of the composition alone or in combination with other layers thereof. Structure 25 includes a support 27 which is preferably a transparent film such as a film of polyester, a subbing layer 29, e.g., a layer of polyvinyl alcohol, a photosensitive layer 31 of the composition of this invention, and a release layer 33, e.g., a film which is releasable adhered to layer 31 by a force which will permit its removal from structure 25 at any stage without disturbing the remaining components of structure 25. Release layer 33 may be opaque to actinic radiation requiring removal prior to exposure or may be transparent, permitting its retention if desired during the exposure step of the processing. Likewise, support 27 and subbing layer 29 may be transparent to actinic radiation permitting exposure of structure 25 from the support 27 side thereof or one or both of layers 27 and 29 may be opaque.

Figure 3:
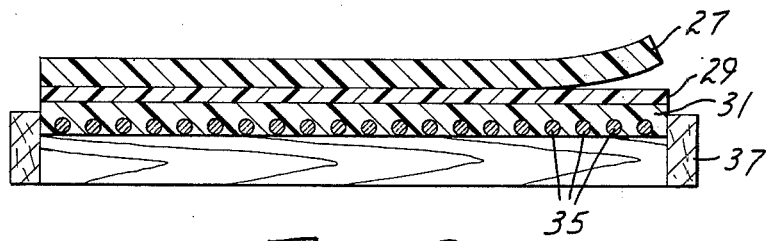
FIG. 3 is an elevational view in cross-section of the structure of FIG. 2 upon application to a silk-screen type mesh.

FIG. 3 depicts the multilayered structure 25 of FIG. 2 after transfer to a silk screen mesh 35 having a frame 37. Prior to transfer, release layer 33 is removed and the remaining components of structure 25 are then placed on the mesh 35 with the photosensitive layer 31 face down. The photosensitive layer 31 is sufficiently tacky to adhere to various substrates without the need for undue pressure. Tackifying agents may be added to the photosensitive layer 31 to increase tack if desired, care being taken to select agents which will not deleteriously affect the photosensitivity of the layer.

After application of structure 25 to the silk screen mesh 35 by pressure, heat, or pre-wetting the mesh with solvent, the support 27 is peeled away, leaving the subbing layer 29 and photosensitive layer 31. The forces of adhesion of the various layers of structure 25 as well as force of adhesion of photosensitive layer 31 to the silk screen mesh 35 are adapted to permit the various operations described above. The subbing layer serves a variety of useful purposes including providing initial adhesion between the support 27 and the photosensitive composition 31, providing sufficient support so that support layer 27 may be removed prior to exposure, covering the tacky surface of photosensitive layer 31 after removal of support 27, and providing an oxygen barrier to promote free radial polymerization.

After removal of the film support 27, the silk screen mesh 35 covered with the remaining layers 29 and 31 of structure 25 is exposed to a light pattern in the manner described above and developed either with dilute acid or base to obtain a positive or negative of the light pattern, respectively. Negative development is highly preferred in this silk screen application of the invention. Positive development removes the exposed, polymerized areas of the stencil leaving the nonpolymerized image on the screen mesh. To achieve maximum adhesion and solvent resistance, the stencil requires post exposure to effect polymerization in these areas. The developed silk screen is then placed in a press and copies produced in the conventional manner. After use, the silk screen mesh 35 can be reclaimed by treatment with 5–10% aqueous acetic acid. During this step, the image area does not dissolve, it lifts off the screen mesh as discrete polymer fragments which may be removed from the acid solution by filtration. This ability to reclaim the silk screen by removal of the developed image quickly and conveniently is regarded as a significant advantage accruing from the dual development capabilities of the composition of this invention.

The free radical polymerizable monomer employed in the composition of this invention is a free radical polymerizable nongaseous monomer having at least one and preferably a plurality of terminal vinyl groups and a boiling point above about 100° C. The monomer should be free of moieties which will interfere with, by chemical reaction or otherwise, the polymeric blend of components of the composition. Acidic or basic (ionic) moieties such as carboxyl groups, sulfonic acid groups, phosphonic acid groups, amino groups, quaternary ammonium salt groups, or the like are regarded as of this type.

Suitable free radical polymerizable, nongaseous monomers that may be used include both mono- and polyethylenically unsaturated monomers. Examples of monoethylenically unsaturated monomers include for example, methyl methacrylate, ethyl acrylate, butyl acrylate, n-hexyl acrylate, stearyl acrylate, acrylamide, N-methylacrylamide, N-ethanolacrylamide, methacrylamide, vinyl benzoate, N-vinylpyrrolidone, N-vinylsuccinimide, styrene, vinylnaphthalene, and the like. Examples of polyethylenically unsaturated monomers include ethyleneglycol diacrylate, triethyleneglycol diacrylate, tetraethyleneglycol diacrylate, polyethyleneglycol diacrylate, glycerol triacrylate, trimethylolpropane triacrylate, pentaerythritol triacrylate, pentaerythritol tetraacrylate, bis[p-(3-acryloxy-2-hydroxypropoxy)phenyl]-dimethylmethane, bis[p-(2-acryloxyethoxy)-phenyl]dimethylmethane, tris-(2-hydroxyethyl)isocyanurate triacrylate, and sorbitol hexacrylate. The corresponding methacrylate esters may also be used as well as mixtures of these esters with monoethylenically unsaturated monomers. The preferred free radical polymerizable monomers are the polyethylenically unsaturated monomers having at least two and most preferably three or four terminal vinyl groups such as pentaerythritol triacrylate, pentaerythritol tetracrylate, and tris-2-(hydroxyethyl)isocyanurate triacrylate.

Photoinitiators suitable for use in the photosensitive composition of the invention are compounds which on exposure to actinic radiation, generate free-radicals capable of polymerizing monomers having at least one terminal vinyl group. Examples of suitable photoinitiators include the vicinal polyketaldonyl compounds described in U.S. Pat. No. 2,367,660, the alpha-carbonyls described in U.S. Pat. Nos. 2,367,661 and 2,367,670, the acyloin ethers described in U.S. Pat. No. 2,448,828, the alpha-hydrocarbon substituted aromatic acyloins described in U.S. Pat. No. 2,722,512, the polynuclear quinones described in U.S. Pat. Nos. 3,046,127 and 2,951,758, and the triarylimidazolyl dimer/p-aminophenyl ketone combination described in U.S. Pat. No. 3,549,367. Other suitable photoinitiators are organic halogen compounds capable of generating halogen-containing free radicals on exposure to light (see for example, Beebe et al., U.S. Pat. Nos. 1,587,270 through 1,587,274; Munder U.S. Pat. No. 3,512,975; and assignee's copending patent application Ser. No. 177,851) and have the general formula:

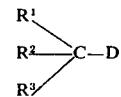

wherein D may be chlorine, bromine or iodine and $R^1$, $R^2$, and $R^3$ may be chlorine, bromine, iodine, hydrogen or alkyl (which may, if desired, be substituted by halogen) aryl, aralkyl, alkenyl or a heterocyclic group, the groups being if desired, also substituted by alkyl or halogen or preferably by a chromophoric group. $R^1$, $R^2$, and $R^3$ may be the same or different or taken together may form part of a heterocyclic quasi-aromatic ring, e.g., pyridine, furane, s-triazine or the like.

Examples of organic halogen compounds falling under this general definition include, for example, iodoform, carbon tetrabromide, carbon tetraiodide, tetrabromoethane, α, α, α, tribromoacetophenone, α, α, α,4-tetrabromacetophenone, N-bromosuccinimide, tetrabromopyrrol, tetraiodopyrrol, hexachlorobenzene, chlorosuccinimide, tetrabromo-o-cresol, cyanuric chloride, and the preferred organic halogen compounds are halomethyl-s-triazines, e.g., trichloromethyl-s-triazine, tribromoethyl-s-triazine, dichloromethyl-s-triazine, 2-trichloromethyl-4-methyl-s-triazine, 2,4-bis(trichloromethyl)-s-triazine, 2,4-bis(trichloromethyl)-6-methyl-s-triazine, 2,4-bis(tribromomethyl)-6-methyl-s-triazine 2,4,6-tris(trichloromethyl)-s-triazine, 2,4,6-tris(tribromomethyl)-s-triazine, 2,4,6-tris(triiodomethyl)-s-triazine and the chromophore substituted vinyl-halomethyl-s-triazines disclosed in the before mentioned patent application Ser. No. 177,851, e.g.:

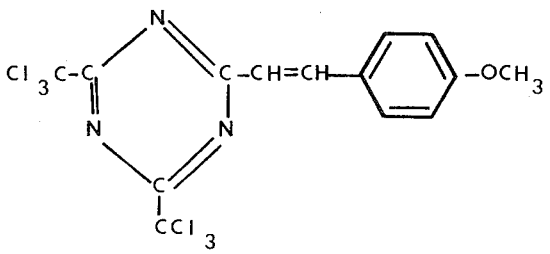

2,4-bis(trichloromethyl)-6-(4-methoxy)-styryl-s-triazine.

Suitable acid-soluble, amino containing polymers useful in the blend of the invention include homopolymers of aminoacrylic compounds or copolymers of an ethylenically unsaturated compound and at least 5% by weight of an aminoacrylic compound. Such polymers are prepared by the homopolymerization of aminoacrylic compounds or the copolymerization of aminoacrylic compounds with other ethylenically unsaturated compounds that are copolymerizable therewith (see, for example, Graves, U.S. Pat. No. 2,138,763).

Suitable aminoacrylic compounds include, for example, 2-aminoethyl acrylate, 2-methylaminoethyl acrylate, 2-ethylaminoethyl acrylate, 2-n-butylaminoethyl acrylate, 2-n-butylaminoethyl acrylate, 2-dimethylaminoethyl acrylate, 2-diethylaminoethyl acrylate, 3-dimethylaminopropyl acrylate, 6-ethylaminohexyl acrylate, 11-dimethylaminoundecyl acrylate, 18-dimethylaminooctadecyl acrylate, N-piperidinoethyl acrylate, N-morpholinoethyl acrylate, 4-dimethylaminophenyl acrylate, N-(2-aminoethyl) acrylamide, N-(2-dimethylaminoethyl)-N-methylacrylamide. N-(3-diethylaminopropyl)-N-methylacrylamide, and the corresponding methacrylate esters and amides.

Suitable ethylenically unsaturated compounds that may be copolymerized with the aminoacrylic compounds to prepare the acid soluble polymers useful in the blend include acrylic esters, e.g., methyl acrylate, ethyl acrylate, butyl acrylate, 2-ethylhexyl acrylate, decyl acrylate, octadecyl acrylate and corresponding methacrylate esters; vinyl esters, e.g., vinyl acetate, vinyl propionate, vinyl dodecanoate, vinyl octadecanoate; isopropenyl esters, e.g., isopropenyl acetate; olefins, e.g., ethylene, propylene, butylene, butadiene, isoprene, styrene; amides, e.g., acrylamide; methacrylamide, N,N-dimethyl-methacrylamide; vinyl pyrrolidone; tetrahydrofurfuryl methacrylate; and mixtures of the foregoing. Preferred acid soluble polymers include those of the formula

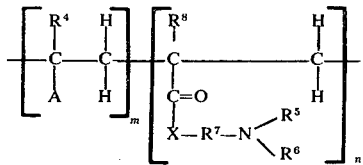

wherein $R^4$ is hydrogen or methyl; A is selected from the class consisting of hydrogen, alkyl having up to 18 carbon atoms, vinyl, isopropyl, phenyl, alkoxy having up to 18 carbon atoms, alkoxycarbonyl having up to 18 carbon atoms, carboalkoxy having up to 18 carbon atoms, tetrahydrofuryloxycarbonyl, carbamoyl, N,N-di (lower alkyl) carbamoyl, pyrrolidinyl, and cyano groups; $R^5$ and $R^6$ are each selected from the class consisting of hydrogen, lower alkyl, and phenyl groups and $R^5$ and $R^6$ together with the N may be a piperidino or morpholino group; $R^7$ is selected from divalent alkylene having 2 to 18 carbon atoms and phenylene groups; $R^8$ is hydrogen or lower alkyl group; X is oxygen or N-$R^9$ wherein $R^9$ is hydrogen or a lower alkyl group, $m$ is zero or a positive integer; and $n$ is a positive integer. The numerals $m$ and $n$ in general have a value such as to provide a polymer having a molecular weight of about 10,000 to 2,000,000 or more, the value of $m + n$ being from about 60 to about 12,000 or more and the ratio $m/m+n$ being from 0 to about 0.95. Unless otherwise stated herein, lower alkyl means an alkyl group having 6 or less carbon atoms. Preferably the amino moiety

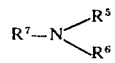

is a tertiary amino moiety.

The acid insoluble polymer useful as a component in the photosensitive composition of the invention may be any film forming polymer that is compatible with the aminoacrylic polymer and which is not soluble in dilute aqueous acid.

Tests for determining suitable acid insoluble polymers for use herein may be performed as follows. An approximately 20% solution of the polymer is prepared in a solvent which is also a solvent for the acid soluble polymer described above. Then:

1. (film-forming)
   A portion of the solution is cast as a thin coating onto a flat surface such as a glass microscope slide and the coating allowed to dry. The polymer is positive for this test if a continuous film is obtained.
2. (acid-insoluble) p1 A 5% solution of acetic acid in water is applied to the coating and the coating gently swabbed with a soft pad. The test is positive for those polymer coatings that do not dissolve.
3. (compatible)
   A portion of the solution is added dropwise with stirring to about an equal volume of an approximately 20% solution of a polymer such as 2-dimethylaminoethyl methacrylate or an acid soluble polymer which the polymer here under test is proposed to be combined with in accordance with this invention. The polymer under test is positive if a solution not having agglomerated or precipitated polymer material is obtained.

Polymers showing a positive result in all of the above tests are regarded as suitable in the practice of this invention. Polymers that are positive with respect to these three tests may be selected from a wide variety of polymers including (1) polyacrylate polymers, e.g., homopolymers of acrylic and methacrylic esters and copolymers of these esters with vinyl monomers including vinyl acetate, vinyl chloride, styrene, acrylic acid, methacrylic acid, maleic acid, styrene, and the like; (2) polymers of vinyl esters, e.g., homopolymers such as polyvinyl acetate and copolymers of vinyl esters, especially vinyl acetate, and maleic acid, acrylic acid, methacrylic acid; (3) partially hydrolized polyvinyl acetate; and (4) aldehyde derivatives of polyvinyl alcohol such as polyvinyl butyral. Particularly suitable polymers are vinyl acetate copolymers that contain pendent carboxyl groups, e.g., copolymers of vinyl acetate with maleic acid, methacrylic acid, and acrylic acid; and the aldehyde derivatives of polyvinyl alcohol, e.g., polyvinyl butyral.

The relative amounts of the components that may be used in the photosensitive composition may be varied over a wide range. Thus, in the mixture or blend of acid soluble and insoluble polymers, which may be considered as the binder for the composition, from about 0.5 to about 5 parts by weight and preferably from about 1.5 to 2.5 parts by weight of film forming, acid insoluble polymer per part by weight of acid soluble polymer may be used. When more than about 5 parts by weight of film forming polymer per part by weight of acid soluble polymer is used the production of positive images becomes difficult because the binder becomes insensitive to the acid developers. Also, with less than about 0.5 parts by weight of film forming polymers per part by weight of acid soluble polymer is used, positive images are not readily obtained because the binder becomes too soluble in acid developers.

About 0.4 to 4 parts by weight of free-radical polymerizable monomer may be used per part by weight of binder. Generally, the lower viscosity of the monomer, the lower the ratio of monomer to binder and the higher the viscosity of the monomer, the higher the ratio of monomer to binder. It is preferable to use about 1 to 2 parts by weight of monomer per part by weight of binder.

The photoinitiator in the photosensitive composition is used in an amount sufficient to effect polymerization of said free-radical polymerizable monomer upon exposure to actinic radiation for a readily determined sufficient time depending upon the intensity of the radiation. Initiator present in an amount of about 0.5 to 6% by weight and preferably 1.5 to 2.5% by weight of the total weight of the composition has proved suitable.

Various additives may be included in the composition of this invention so long as they do not interfere with the operation of any of the components thereof. Pigments may be added to provide contrasting color between areas of the composition retained after development and the visible surface of the substrate previously underlying the removed areas of the exposed composition. The sensitivity of the composition to actinic radiation of a particular wavelength may often be increased by the incorporation of an optical sensitizer including cyanine, carbocyanine, merocyanine, styryl, acridine, and photoreducible dyes, polycyclic aromatic compounds and polyacrylamines.

The silk screen system noted above is found to have several advantages over conventional silk screen systems. These advantages include a stable, presensitized imaging media, shorter exposure times (1 minute versus 5 minutes or more under normal exposure conditions), a shorter access time by a factor of four, reclaimability both as to the silk screen and the acid developer, and useability with both aqueous and organic solvent based printing inks. The multilayer structure designated by the numeral 25 but without release layer 33 may be applied to the silk screen or other substrate (e.g., the conductive layer in the case of a printed circuit board) before or after exposure to actinic radiation, although the former is preferred.

The support film depicted in the multilayered structure of FIG. 2 is preferably flexible, self-supporting and impermeable (i.e., it is nonporous and is not penetrated by, or permeable to, water or other liquids or developing agents). It imparts dimensional stability to the laminate because it is not swelled by, or otherwise sensitive to, moisture. Consequently, layer 27 prevents wrinkling of the laminate during storage, shipment, and subsequent lamination steps. Preferably, support 27 is a thin, tough, flexible sheet or film (e.g., plastic film) having a thickness less than about 20 mils, although much thicker sheets or films can also be used. Typically, support sheet 27 is a thin film of polyethylene terephthalate, polyethylene or polyethylene coated paper. Other suitable carrier sheets include cellulose acetate, cellophane, polypropylene, polyvinyl chloride, polyesters, polysulfones, and other tough plastic films known to the art. If desired, the surface of support sheet 27 which is bonded to layer 29 may be treated with conventional release agents (e.g., low-adhesion backsizes) to reduce the bond strength between support sheet 27 and subbing layer 29. Such treatment of support shet 27, however, is not required.

Subbing layer 29 is preferably a clear, transparent, material which adheres more strongly to light-sensitive layer 31 than to support sheet 27. Preferably, the subbing layer is also water-soluble. Subbing layer 29 is normally nontacky (i.e., it is nontacky under ambient conditions). Since subbing layer 29 is clear and transparent, there is no need for its removal before exposing layer 31 to actinic radiation. Rather, it is desired to leave subbing layer 29 in place until after such exposure to actinic radiation because it protects light-sensitive layer 31 from contaminants and possible damage during the exposure step. Subbing layer 29 also serves to prevent imaging patterns from sticking to tacky light-sensitive layers in the vacuum frames and also serves as an oxygen barrier during exposure (i.e., it prevents oxygen from inhibiting the reactivity of light-sensitive materials during exposure).

In the case where subbing layer 29 is water-soluble it is efficiently and conveniently removed from the exposed light-sensitive layer with water or water-compatible developing solutions. The thickness of subbing layer 29 is typically about 0.1 mil to 2 mils, with 0.15 mil to 1 mil being a preferred thickness.

Subbing layer 29 is preferably a mechanically strong, self-supporting film of polyvinyl alcohol. Such films are also oxygen-impermeable and thus are effective as oxygen barriers when using organic light-sensitive materials whose activity with free radicals is inhibited by oxygen. Other useful subbing layers which can form self-supporting films include high molecular weight polyvinyl pyrollidone, polyacrylamide, water-soluble cellulose ether, and high molecular weight polyethylene oxide.

The thickness of photosensitive layer 31 is typically in the range of about 0.5 mil to about 4 mils, although thinner or thicker layers can also be readily used.

Protective release layer 33 is releasably bonded to one surface of layer 31 and is easily hand-strippable or detachable from such surface. Layer 33 serves merely to protect light-sensitive layer 31 from damage during storage and shipping. Typically, layer 33 is a thin, flexible polyethylene film (e.g., 1–5 mils thick) which may have one surface thereof treated with a conventional release agent.

In order to eliminate the need for a protective liner it is possible to apply a conventional release agent to the back side of the support sheet so that the light-sensitive laminate may be wound into a roll or placed in stacks. In this manner the light-sensitive layer is protected from damage by the underlying support sheet. The release agent prevents the light-sensitive layer from firmly bonding to the back side of the carrier sheet.

The conditions employed to bond the light-sensitive layer 31 of structure 25 to a substrate depends upon several factors including the tackiness of the light-sensitive layer and the nature of the surface of the substrate. Generally speaking, the amount of heat and pressure used to laminate the light-sensitive structure 25 (without the release layer 33) to a substrate decreases as the degree of tackiness of light-sensitive layer 31 increases. Thus, high pressure (e.g., several hundred pounds per square inch) and temperature (e.g., up to 100° C. are often used to laminate when layer 31 is completely nontacky, whereas very little pressure (e.g., about 10 pounds per square inch) is used with no externally applied heat when layer 31 is highly tacky.

To expose the light-sensitive layer after it has been bonded to the desired substrate, the composite structure (i.e., subbing layer 29/light-sensitive layer 31/substrate 35) is first placed in a vacuum frame or other suitable holder after which an imaging pattern is laid over subbing layer 29. The light-sensitive layer is then exposed to actinic radiation through the imaging pattern and the subbing layer 29. Typical sources of actinic radiation include carbon arc light, water-cooled mercury arc tubes, quartz, tungsten/halogen lamps and other conventional sources well known in the art. Less than 2 minutes exposure to carbon-arc or any other high intensity ultraviolet radiation source or several minutes to sunlight has proved sufficient.

After exposure, subbing layer 29 is removed such as by washing with water or with water-containing developing solution. To obtain positive development (removal of unexposed regions of the light-sensitive layer), dilute acid is employed as the developer. Dilute aqueous acetic acid (vinegar strength 2–5% by volume) is preferred, but other organic acids as well as dilute mineral acids function equally well. In the case of the positive development, soaking of the imaged structure in dilute acid solutions with slight or no agitation is sufficient. In many cases the remaining, non-exposed light-sensitive layer forming the positive image is quite soft at least until dried and care should be taken against rubbing or physically disturbing the image until dry. Removal of the exposed light-sensitive layer appears to involve a breakdown in the adhesion between the light-sensitive layer and the substrate allowing the light-sensitive layer and the substrate allowing the light-sensitive layer to be lifted off. The exposed, light-sensitive layer that is released from the substrate during development may be removed by filtration and the acid developer reclaimed.

Negative development, involving removal of the unexposed portions of the light-sensitive layer, may be accomplished by treatment with a dilute aqueous base, e.g., a 0.1% by weight ammonia solution. The exposed portions of the light-sensitive layer being tougher than the unexposed portions to be removed, more physical action such as rubbing, swabbing or spraying can be employed in negative development.

The preparation of printed circuit boards or the like may be accomplished employing either the positive or negative development procedures described above. If positive development is employed, it is highly desirable to post-expose the retained, still light-sensitive layer to insure good resistance to the common commercial copper etch baths (e.g., ammonium persulfate and ferric chloride). In both positive and negative cases, the relief image can be simply and easily removed by a dilute acetic acid soak, the preferred removal being accomplished by soaking in a 5–15% by volume aqueous acetic acid solution for a period of 3–5 minutes. This ability to readily remove the relief image with common aqueous media is regarded as a major advantage over existing methods which typically require strong mineral acids and/or strong chlorinated solvents both of which are hazardous to health and environment.

The light-sensitive structure depicted in FIG. 2 is generally prepared by coating a solution of the subbing layer (e.g., polyvinyl alcohol) onto the support sheet followed by drying to form the subbing or bonding layer. The resulting bond between the support sheet and the subbing layer can be described as an intimate clinging engagement of the subbing layer to the support sheet which results from drying the wet subbing layer in situ at slightly elevated temperatures (e.g., 125°–200° F.).

EXAMPLE 1

A 40% solids solution of 1.9 parts of a polyvinyl acetate having pendant carboxyl groups having the tradename Gelva $C_5V_{16}$ available commercially from Monsanto Chemical Co., 1 part dimethylaminoethyl methacrylate homopolymer, 2.9 parts of the triacrylate of tris-2-hydroxyethyl(isocyanurate) available under the tradename SR-368 from Sartomer Chemical Co., 0.066 parts 2,4-bis(trichloromethyl)-6-(4-methoxy)s-tyryl-s-triazine, and 8.8 parts of a solvent system consisting of 95% methyl ethyl ketone and 5% water (by vol.) is knife coated on an unsubbed polyester film support at 2 mils wet thickness and allowed to air dry. A transparent original is placed in intimate contact with the film and exposed for a period of 20 seconds to the light from a 275 watt mercury vapor Hanovia lamp at a distance of 12 inches. After removal of the original, the unexposed regions are removed using a 0.1% aqueous $NH_4OH$ solution and mild rubbing. A negative relief image of the original having excellent fidelity and sharpness is obtained.

EXAMPLE 2

The procedure of Example 1 is followed except that the exposed film is developed by immersion in a tray containing 5% aqueous acetic acid for a period of 15–30 seconds with mild agitation. During this time the exposed regions of the film lift off the polyester support leaving an exact copy of the original. The positive relief image obtained in this example is quite soft and must not be rubbed prior to drying. After air drying, there is obtained a tough positive relief image of the original having excellent fidelity and sharpness.

EXAMPLE 3

The solution of Example 1 is prepared except that the triazine initiator is replaced by the following initiator/sensitizer system:
  0.02 parts — 2,4-bis(trichloromethyl)-6-(4-methoxy)styryl-s-triazine
  0.04 parts — 2,4-bis(trichloromethyl)-6-methyl-s-triazine
  0.01 parts — 4-dimethylaminobenzal acetone After coating as in Example 1, the film is exposed through a transparent original for a period of 30 seconds to the visible light from a 120 volt (15,000 f.c.s.) tungsten iodide lamp at a distance of 8 inches. Following the developing procedure of Example 1, a high quality negative relief image of the original is obtained. Developing another piece of the same exposed film according to the procedure of Example 2 results in a good quality positive relief image of the original.

The positive and negative relief images prepared according to this example are capable of being transferred to a variety of surfaces, e.g., paper, glass, metal, wood, plastics, cloth, etc., using pressure and/or heat to effect the transfer. Pressures of approximately 10–20 pounds/square inch and/or heat (~24°–30° C.) are sufficient to effect complete transfer of the positive image. Slightly higher pressures, (40–50 pounds/square inch) and/or higher temperatures, (~37°–50° C.) are required to effect transfer of the negative image.

EXAMPLE 4

The solution of Example 1 is prepared except that the homopolymer of 1 part dimethylaminoethyl methacrylate is replaced by 1 part of a homopolymer of diethylaminoethyl methacrylate. Positive and negative development as in Example 3 results in good quality images.

EXAMPLE 5

The procedure described in Example 4 is repeated using 1 part dimethylaminoethyl acrylate. Similar results are obtained.

EXAMPLE 6

The procedure described in Example 4 is followed using 1 part dimethylaminopropyl methacrylate. Similar results are obtained.

EXAMPLE 7

The procedure described in Example 4 is followed using 1 part dimethylaminoundecyl methacrylate. Similar results are obtained.

EXAMPLE 8

The procedure of Example 4 is repeated using 1 part of the 3/1 by weight copolymer dimethylaminoethyl methacrylate/isoamyl acrylate. Positive and negative development of the knife coated, dried films, as in Example 3 results in high quality images showing excellent adhesion to the polyester film base.

EXAMPLE 9

The procedure of Example 4 is repeated using 1 part of the 1/1 by weight copolymer dimethylaminoethyl methacrylate/lauryl methacrylate. Similar results are obtained.

EXAMPLE 10

The procedure of Example 4 is repeated using 1 part of the 1/1 molar ratio copolymer dimethylaminoethyl methacrylate/tetrahydrofurfuryl methacrylate. Similar results are obtained.

EXAMPLE 11

The solution of Example 1 is prepared except that the Gelva $C_5V_{16}$ is replaced by 1.9 parts of a formaldehyde derivative of polyvinyl alcohol available under the tradename Formvar 7/70. The solvent system in this case is acetone. Positive and negative development of the knife coated, dried films results in excellent relief images in both cases. The important difference demonstrated by this example is that the positive image is no longer soft when wet and can be developed by rubbing or swabbing while in the dilute aqueous acetic acid bath.

EXAMPLE 12

The procedure in Example 11 is followed using 1.9 parts of hydroxypropylcellulose, available from Hercules Chemical Company under the tradename Klucel L, in place of Gelva $C_5V_{16}$. Similar results are obtained.

EXAMPLE 13

The procedure of Example 11 is followed using 1.9 parts of a diacetone acrylamide/formaldehyde condensation product sold under the tradename DAATS by the Lubrizol Corporation in place of Gelva $C_5V_{16}$. Positive development using 0.5% by volume aqueous acetic acid and negative development using plain water results in excellent quality images in both cases.

EXAMPLE 14

The procedure in Example 11 is followed using 1.9 parts of a copolymer containing 1 part by weight polyvinyl pyrrolidinone and 3 parts by weight methyl methacrylate in place of Gelva $C_5V_{16}$. Similar results are obtained.

EXAMPLE 15

This example illustrates the production of photopolymer silk screen stencil material. A mixture of 2134 g. Gelva $C_5V_{16}$ (tradename for a polyvinyl acetate having pendant carboxyl groups available from Monsanto Chemical Company)
250 g. Pycal 94 (tradename for a polypropylene aryl ether available from Atlas Chemical Industries),
175 g. Monastral Blue pigment, and
3700 g. methyl ethyl ketone is ball milled for about 8 hours. There is obtained about 6250 g. of mill base having a solids content of 41.0 w./w. percent.

A portion of the mill base obtained is mixed to form a coating mixture as follows.

2540 g. of the mill base (1050 g. solids),
320 g. polydimethylaminoethyl methacrylate,
419 g. SR 259 (tradename for the diacrylate ester of polyoxyethylene glycol having an average molecular weight 200, available from Sartomer Chemical Company),
838 g. SR 295 (tradename for pentaerythritol tetraacrylate having a molecular weight of 352, available from Sartomer Chemical Company),
838 g. SR-368 (tradename for the triacrylate of tris(2-hydroxyethyl)-isocyanurate having a molecular weight of 423, available from Sartomer Chemical Company),
66 g. phenanthrenequinone (80% technical grade available from Aldrich Chemical Company),
3330 g. methyl ethyl ketone,
1000 g. ethanol, and
200 g. water (added to improve the solubility of the Gelva)

The coating mixture, after stirring until thoroughly dissolved, has a viscosity of 305 centipoise, a solids content of 37%, a ratio of polymerizable monomers to polymer of 1.75 to 1, and a ratio of carboxyl containing polymer to basic polymer of 2.75 to 1. There is 2% photoinitiator based on total solids in the mixture.

A support film is prepared by coating and drying a 24 inch (61 cm.) wide, 3 mil (75 micron) polyester film with a 4% solution of Elvanol 51–05 (tradename for low viscosity, 88% hydrolyzed polyvinyl alcohol available from DuPont Company) plasticized with 6% glycerine (based on polyvinyl alcohol) to give a coating weight of 150 mg/square foot (1.6 grams/square meter).

The polyvinyl alcohol coated polyester film is extrusion knife coated on the polyvinyl alcohol-coated surface at a 10 mil (250 micron) knife setting at a rate of 10 feet (3.45 meters) per minute with the coating mixture. The coated film is dried by passing continuously through coating ovens, 80 feet (27.6 meters) long, at a temperature of 75° to 85° C. The resulting photosensitive film has a coating weight of 5.5 grams/square foot (59 grams/square meter). It is slip-sheeted with a siliconized release liner and wound on a core to give a jumbo roll of silk screen stencil material.

The silk screen stencil material is used as follows: The release liner is removed from a portion of the material and the exposed tacky surface pressed against and into the mesh of a silk screen. The support film is stripped from the construction leaving the polyvinyl alcohol layer on the photosensitive layer on the silk screen. The thus prepared silk screen is exposed through a positive transparent original to a carbon arc for about 2 minutes. The exposed screen is then developed to a negative image by immersion in a 0.1% ammonium hydroxide solution and gentle swabbing with a soft cotton pad. After swabbing the developed surface with a dry towel or cloth the silk screen stencil is ready for use. On a conventional silk screen printer, over 40,000 positive prints having excellent fidelity and sharpness are obtained using either solvent or water based printing pastes. By soaking the silk screen stencil in 5 to 10% aqueous acetic acid, the photopolymer is removed allowing for reuse of the silk screen.

EXAMPLE 16

The film described in Example 15 is pressure applied to a cleaned, normally hydrophilic aluminum printing plate stock. After removal of the polyester support sheet, the plate is exposed to ultraviolet light as in Example 15 and developed using either positive or negative developers as desired. The result is a lithographic printing plate with the capability of producing either positive or negative print.

EXAMPLE 17

The film described in Example 15 is repeatedly applied, exposed, and developed in order to obtain a thick stencil quite suitable for lay down of thick layers of ink. Such a composite build up of thickness is very useful for thick film printing (e.g., resistive and conductive paths on ceramic wafers).

EXAMPLE 18

The film described in Example 15 is pressure applied to a cleaned 3 mil brass shim stock, then exposed after removal of the polyester support sheet to ultraviolet light as in example 15 and developed in 0.1% NH$_4$OH. Introduction into a commercial FeCl$_3$ etch bath with subsequent removal of the resist image using 10% aqueous acetic acid results in a metal mask having good edge quality.

What is claimed is:
1. An article comprising a substrate having thereover a light-sensitive layer comprising:
   1. at least one free-radical polymerizable monomer having at least one terminal vinyl group and a boiling point above 100°C., said monomer being free of acidic and basic moieties,
   2. at least one photoinitiator in an amount sufficient to polymerize said polymerizable monomer upon exposure to actinic radiation, and
   3. a blend comprising:
      a. at least one acid soluble amino containing polymer of the formula

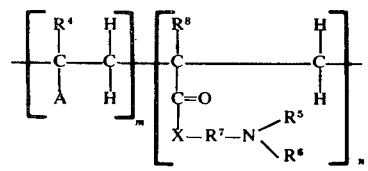

wherein $R^4$ is hydrogen or methyl; A is selected from the class consisting of hydrogen, alkyl having up to 18 carbon atoms, vinyl, isopropenyl, phenyl, alkoxy having up to 18 carbon atoms, alkoxycarbonyl having up to 18 carbon atoms, carboalkoxy having up to 18 carbon atoms, tetrahydrofurloxycarbonyl, carbamoyl, N,N-di(lower alkyl) carbamoyl, pyrrolidinyl, and cyano groups; $R^5$ and $R^6$ are each selected from the class consisting of hydrogen, lower alkyl, and phenyl groups and $R^5$ and $R^6$ together with the N may be a piperidino or morpholino group; $R^7$ is selected from divalent alkylene having 2 to 18 carbon atoms and phenylene groups; $R^8$ is hydrogen or lower alkyl group; X is oxygen or N-$R^9$ wherein $R^9$ is hydrogen or a lower alkyl group; $m$ is zero or a positive integer; and $n$ is a positive integer; and
      b. at least one compatible, acid insoluble, film-forming polymer,
   said free radical polymerizable monomer and said components of said blend being present in an amount sufficient to allow said composition upon imagewise actinic radiation exposure to be developed positively and negatively as desired.

2. The article of claim 1 wherein said free-radical polymerizable monomer is present to the extent of 0.4 to 4 parts by weight per part by weight of said blend, and said filmforming polymer is present to the extent of 0.5 to 5 parts by weight per part by weight of said acid soluble amino containing polymer.

3. The article of claim 1 wherein said substrate is a flexible, self-supporting, impermeable film.

4. The article of claim 1 wherein a layer of a transparent bonding composition is interposed between said substrate and said light-sensitive layer.

5. The article of claim 4 wherein said substrate is a polyester film and said bonding composition is polyvinyl alcohol.

6. The article of claim 1 wherein said substrate is a screen meesh.

7. The article of claim 1 wherein said light-sensitive layer has thereon a release layer adhered thereto by a force insufficient to disturb the remaining layers of said article upon removal of said release layer.

8. The article of claim 1 wherein said substrate has a surface facing said light-sensitive layer which is electrically conductive.

9. The article of claim 1 wherein said substrate has a surface facing said light-sensitive layer which is oleophobic.

10. The article of claim 1 wherein said free radical polymerizable monomer has a plurality of terminal vinyl groups and said amino containing polymer is a polymer of the formula

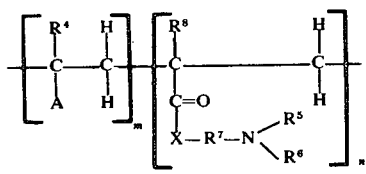

wherein $R^4$ is hydrogen or methyl; A is selected from the class consisting of hydrogen, alkyl having up to 18 carbon atoms, vinyl, isopropenyl, phenyl, alkoxy having up to 18 carbon atoms, alkoxycarbonyl having up to 18 carbon atoms, carboalkoxy having up to 18 carbon atoms, tetrahydrofuryloxycarbonyl, carbamoyl, N,N-di(lower alkyl) carbamoyl, pyrrolidinyl, and cyano groups; $R^5$ and $R^6$ are each selected from the class consisting of hydrogen, lower alkyl, and phenyl groups and $R^5$ and $R^6$ together with the N may be a piperidino or morpholino group; $R^7$ is selected from divalent alkylene having 2 to 18 carbon atoms and phenylene groups; $R^8$ is hydrogen or lower alkyl group; X is oxygen or $N-R^9$ wherein $R^9$ is hydrogen or a lower alkyl group; $m$ is zero or a positive integer; and $n$ is a positive integer.

\* \* \* \* \*